(12) United States Patent
Salter et al.

(10) Patent No.: US 11,557,706 B2
(45) Date of Patent: Jan. 17, 2023

(54) ADDITIVE MANUFACTURING OF ELECTRICAL CIRCUITS

(71) Applicant: Ford Global Technologies, LLC, Dearborn, MI (US)

(72) Inventors: Stuart C. Salter, White Lake, MI (US); David Brian Glickman, Southfield, MI (US); Paul Kenneth Dellock, Northville, MI (US); Richard Gall, Ann Arbor, MI (US); Harold P. Sears, Livonia, MI (US)

(73) Assignee: Ford Global Technologies, LLC, Dearborn, MI (US)

( * ) Notice: Subject to any disclaimer, the term of this patent is extended or adjusted under 35 U.S.C. 154(b) by 288 days.

(21) Appl. No.: 17/039,545

(22) Filed: Sep. 30, 2020

(65) Prior Publication Data
US 2022/0102601 A1 Mar. 31, 2022

(51) Int. Cl.
*H01L 33/62* (2010.01)
*H01L 33/58* (2010.01)

(52) U.S. Cl.
CPC .............. *H01L 33/62* (2013.01); *H01L 33/58* (2013.01); *H01L 2933/0058* (2013.01); *H01L 2933/0066* (2013.01)

(58) Field of Classification Search
CPC . H01L 33/62; H01L 33/58; H01L 2933/0058; H01L 2933/0066; H01L 33/486
See application file for complete search history.

(56) References Cited

U.S. PATENT DOCUMENTS

| 9,514,988 | B1* | 12/2016 | Lin | ......................... H01L 24/97 |
| 2008/0136004 | A1* | 6/2008 | Yang | ........................ H01L 24/96 |
| | | | | 438/109 |
| 2008/0157336 | A1* | 7/2008 | Yang | ................. H01L 23/49827 |
| | | | | 438/118 |

(Continued)

FOREIGN PATENT DOCUMENTS

| CN | 106211622 | 8/2018 |
| DE | 102014203309 | 8/2015 |
| KR | 20160126800 | 11/2016 |

*Primary Examiner* — Victor A Mandala
(74) *Attorney, Agent, or Firm* — Burris Law, PLLC

(57) ABSTRACT

A method of manufacturing an electronics assembly includes forming a base layer using an additive manufacturing process, forming a first thermally and electrically conductive intermediate layer onto the base layer using an additive manufacturing process, placing an electronics component onto the first thermally and electrically conductive intermediate layer, the electronics component comprising a plurality of vias, forming a second thermally and electrically conductive intermediate layer over the first thermally and electrically conductive intermediate layer and over at least a portion of the electronics component using an additive manufacturing process, wherein a material of the second thermally and electrically conductive intermediate layer extends through the vias to contact the first thermally and electrically conductive intermediate layer and the vias, thereby forming a bond therebetween, and forming a protective layer over at least a portion of the second thermally and electrically conductive intermediate layer using an additive manufacturing process.

20 Claims, 3 Drawing Sheets

(56) References Cited

U.S. PATENT DOCUMENTS

| | | |
|---|---|---|
| 2015/0201499 A1 | 7/2015 | Shinar et al. |
| 2017/0110438 A1* | 4/2017 | Chen .................. H01L 25/0657 |
| 2019/0214385 A1* | 7/2019 | Roberts ............... H01L 27/0694 |
| 2019/0223298 A1* | 7/2019 | Silvano De Sousa ........................ H05K 3/4655 |
| 2019/0373773 A1 | 12/2019 | Bougher et al. |
| 2022/0051908 A1* | 2/2022 | Hu .......................... H01L 24/20 |
| 2022/0082939 A1* | 3/2022 | Liao .................... H01L 23/5383 |

* cited by examiner

ADDITIVE MANUFACTURING OF ELECTRICAL CIRCUITS

FIELD

The present disclosure relates to manufacturing of electrical circuits, and more specifically to manufacturing electrical circuits on printed circuit boards.

BACKGROUND

The statements in this section merely provide background information related to the present disclosure and may not constitute prior art.

Printed circuit boards (PCBs) are used to support and connect electronic components using conductive tracks or members laminated between layers of a non-conductive substrate. Traditional methods of manufacturing PCBs include soldering the electronic components, such as by way of example, processors, diodes, and resistors, for electrical and mechanical connection. These methods can be time consuming and result in PCBs that increase weight in applications such as motor vehicles.

Lightweighting in motor vehicles has become increasingly important in recent years, while the amount of electronics being integrated into motor vehicles is also increasing with the push towards autonomous and "smart" vehicles. An increased number of sensors and electronics are finding their way into motor vehicles, while lightweighting remains an important design consideration. Accordingly, motor vehicle designers are faced with challenges in integrating more electronic components while maintaining a lightweight vehicle.

These issues related to the integration of electronic components in motor vehicles, among other issues related to the manufacturing of electronic components, are addressed by the present disclosure.

SUMMARY

This section provides a general summary of the disclosure and is not a comprehensive disclosure of its full scope or all of its features.

In one form, a method of manufacturing an electronics assembly is provided that comprises: forming a base layer using an additive manufacturing process; forming a first thermally and electrically conductive intermediate layer onto the base layer using an additive manufacturing process; placing an electronics component onto the first thermally and electrically conductive intermediate layer, the electronics component comprising a plurality of vias; forming a second thermally and electrically conductive intermediate layer over the first thermally and electrically conductive intermediate layer and over at least a portion of the electronics component using an additive manufacturing process, wherein a material of the second thermally and electrically conductive intermediate layer extends through the vias to contact the first thermally and electrically conductive intermediate layer and the vias, thereby forming a bond therebetween; and forming a protective layer over at least a portion of the second thermally and electrically conductive intermediate layer using an additive manufacturing process.

In variations of this method, which may be employed individually or in any combination: the base layer is a thermally conductive material; the protective layer is an electrically nonconductive material; the protective layer is thermally conductive; the electronics component is placed onto the first thermally and electrically conductive intermediate layer by a robot; the electronics component comprises an LED, and the method further comprises forming an optical layer adjacent to the LED using an additive manufacturing process; each of the additive manufacturing processes are the same; each of the additive manufacturing processes comprises material jetting or material extrusion; and each of the layers comprise a polymeric material.

In another form of the present disclosure, an electronics assembly is provided that is formed by a process comprising: forming a base layer using an additive manufacturing process; forming a first thermally and electrically conductive intermediate layer onto the base layer using an additive manufacturing process; placing an electronics component onto the first thermally and electrically conductive intermediate layer, the electronics component comprising a plurality of vias; forming a second thermally and electrically conductive intermediate layer over the first thermally and electrically conductive intermediate layer and over at least a portion of the electronics component using an additive manufacturing process, wherein a material of the second thermally and electrically conductive intermediate layer extends through the vias to contact the first thermally and electrically conductive intermediate layer and the vias, thereby forming a bond therebetween; and forming a protective layer over at least a portion of the second thermally and electrically conductive intermediate layer using an additive manufacturing process.

In variations of this electronics assembly, which may be employed individually or in any combination, the electronics component comprises a printed circuit board and at least two conductive pads secured to the printed circuit board, each of the conductive pads comprising an upper surface and a lower surface, wherein the plurality of vias extend through the printed circuit board to connect the upper surfaces to the lower surfaces. In another form, each conductive pad comprises gold plating, wherein the gold plating extends along interior surfaces of the vias, along the upper surfaces, and along the lower surfaces. The electronics component may include an LED secured to the conductive pads and an optical lens disposed adjacent to the LED. In another variation, the electronics component is placed onto the support pad before forming the second thermally and electrically conductive intermediate layer. In still further variations, the second thermally and electrically conductive intermediate layer comprises at least one aperture to provide access to the electronics component, the conductive pads are formed using an additive manufacturing process, and each of the additive manufacturing processes are the same, which may be material jetting or material extrusion.

In still another form of the present disclosure, a method of manufacturing an electronics assembly includes: forming a base layer using an additive manufacturing process; forming a first thermally and electrically conductive intermediate layer onto the base layer using the additive manufacturing process; placing an electronics component onto the first thermally and electrically conductive intermediate layer, the electronics component comprising a plurality of vias; forming a second thermally and electrically conductive intermediate layer over the first thermally and electrically conductive intermediate layer and over at least a portion of the electronics component using the additive manufacturing process, wherein a material of the second thermally and electrically conductive intermediate layer extends through the vias to contact the first thermally and electrically conductive intermediate layer and the vias, thereby forming a bond therebetween; and forming a protective layer over at least a portion of the second thermally and electrically conductive intermediate layer using the additive manufacturing process. In a variation of this method, the additive manufacturing process comprises material jetting or material extrusion.

Further areas of applicability will become apparent from the description provided herein. It should be understood that the description and specific examples are intended for purposes of illustration only and are not intended to limit the scope of the present disclosure.

DRAWINGS

In order that the disclosure may be well understood, there will now be described various forms thereof, given by way of example, reference being made to the accompanying drawings, in which.

Figure 1:
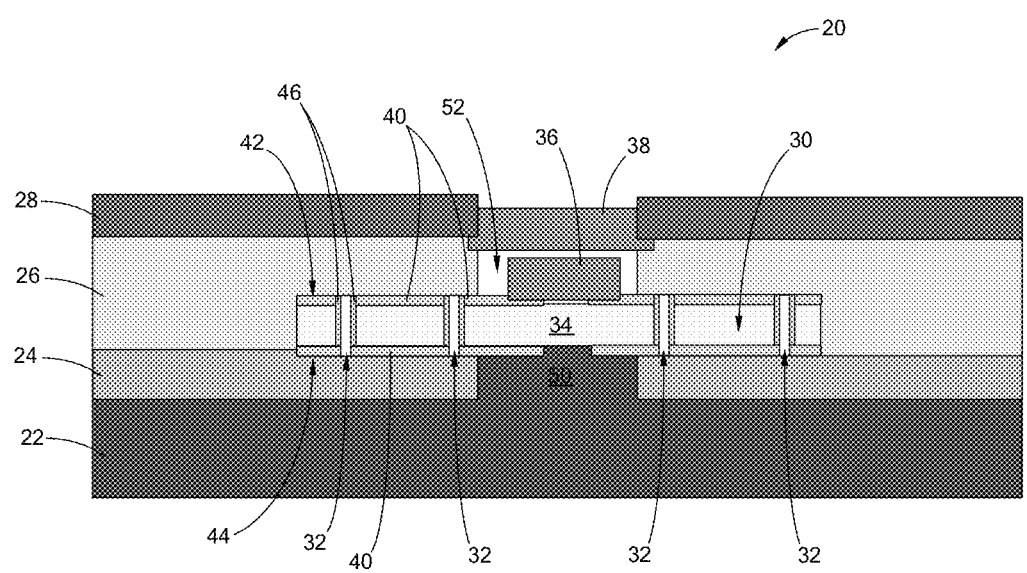
FIG. 1 is a cross-sectional view through an electronics assembly constructed according to the teachings of the present disclosure.

The drawings described herein are for illustration purposes only and are not intended to limit the scope of the present disclosure in any way.

DETAILED DESCRIPTION

The following description is merely exemplary in nature and is not intended to limit the present disclosure, application, or uses. It should be understood that throughout the drawings, corresponding reference numerals indicate like or corresponding parts and features.

Figure 2A:
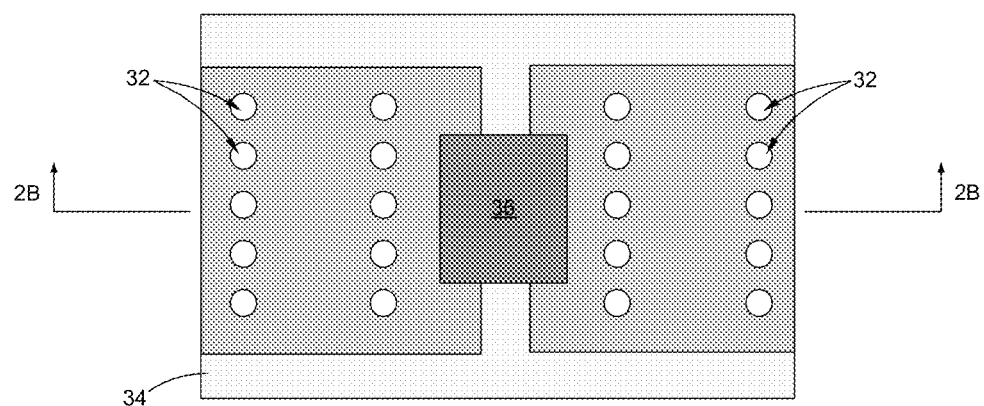
FIG. 2A is a top view of an LED mounted to a printed circuit board and constructed according to constructed according to the teachings of the present disclosure.
Figure 2B:
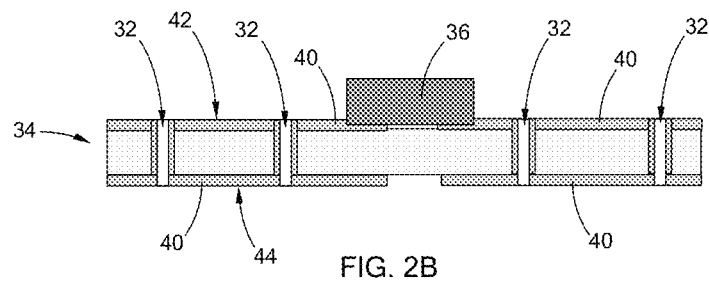
FIG. 2B is a cross-sectional view, taken along line 2B-2B of FIG. 2A.

Referring to FIGS. 1, 2A and 2B, an electronics assembly is illustrated and generally indicated by reference numeral 20. The electronics assembly comprises a base layer 22, a first thermally and electrically conductive intermediate layer 24, a second thermally and electrically conductive intermediate layer 26, a protective layer 28, and an electronics component 30 comprising a plurality of vias (or openings/apertures) 32 disposed within the layers.

The electronics component 30 in one form is a printed circuit board (PCB) 34 and further includes an LED 36 mounted thereon. In one variation, an optical layer 38 (which in one form may be an optical lens) is disposed adjacent to the LED 36. The base layer 22 in one form is a thermally conductive material, and in another form, the protective layer 28 is an electrically nonconductive material. The protective layer 28 may also be a thermally conductive material. Further, the various layers as illustrated and described herein are generally a polymeric material.

Conductive pads 40 are secured to the PCB 34, each of the conductive pads 40 comprising an upper surface 42 and a lower surface 44, wherein the plurality of vias 32 extend through the PCB 34 to connect the upper surfaces 42 to the lower surfaces 44. Accordingly, the vias 32 also include conductive interior surfaces 46. In one variation, each conductive pad 40 comprises gold plating (not shown), wherein the gold plating extends along interior surfaces 46 of the vias 32, along the upper surfaces 42, and along the lower surfaces 44 for increased electrical conductivity. However, it should be understood that the gold plating is optional and may be excluded in order to reduce cost of the electronics assembly 20.

As further shown, the LED 36 is secured to the conductive pads 40. 14. Also, the base layer 22 comprises a support pad 50, and the electronics component 30, which in this form is the PCB 34, is disposed on the support pad 50. In this illustrated form, the second thermally and electrically conductive intermediate layer 26 comprises at least one aperture 52 to provide access to the electronics component 30, as well as the LED 36.

Advantageously, the present disclosure provides a method of manufacturing the electronics assembly 20 using additive manufacturing (AM) processes, which provide a more robust and lightweight package for a variety of applications, including by way of example, motor vehicles.

Figure 3:
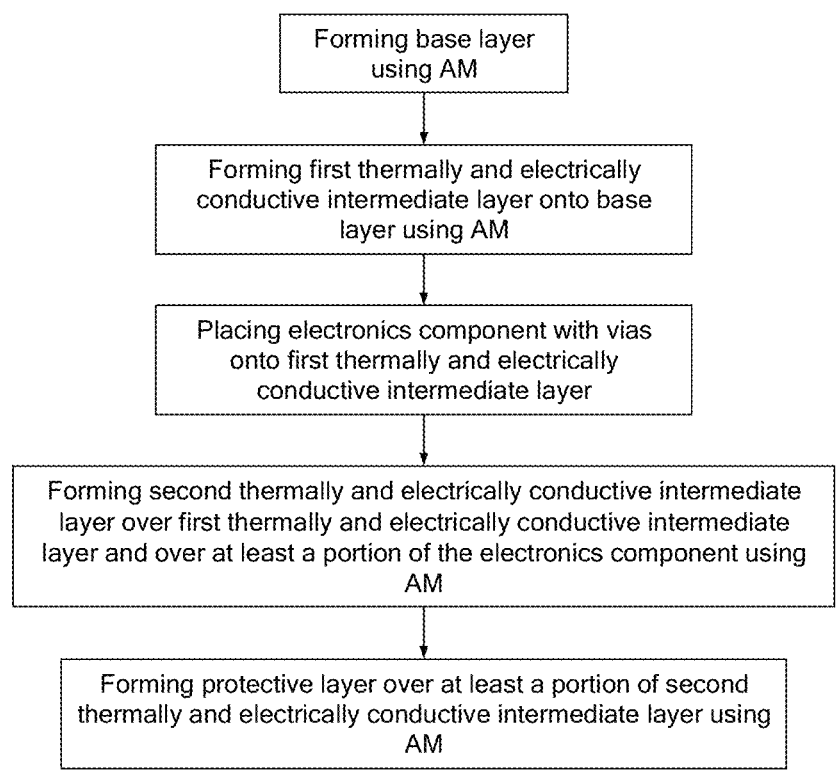
FIG. 3 is a flow diagram illustrating a manufacturing method according to the teachings of the present disclosure.

More specifically, and with reference to FIG. 3, the method of manufacturing the electronics assembly 20 generally includes forming the base layer 22 using an additive manufacturing process, forming the first thermally and electrically conductive intermediate layer 24 onto the base layer 22 using an additive manufacturing process, placing the electronics component 30 onto the first thermally and electrically conductive intermediate layer 24, and forming the second thermally and electrically conductive intermediate layer 26 over the first thermally and electrically conductive intermediate layer 24 and over at least a portion of the electronics component 30 using an additive manufacturing process. As previously illustrated, a material of the second thermally and electrically conductive intermediate layer 26 extends through the vias 32 to contact the first thermally and electrically conductive intermediate layer 24 and the vias 32, thereby forming a bond therebetween. Next, the protective layer 28 is formed over at least a portion of the second thermally and electrically conductive intermediate layer 26 using an additive manufacturing process.

In one form, the electronics component 30 is placed onto the first thermally and electrically conductive intermediate layer 24 by a robot (not shown). And in another form, the optical layer 38 adjacent to the LED 36 is formed using an additive manufacturing process. The conductive pads 40 may also be formed using an additive manufacturing process.

Each of the additive manufacturing processes for each layer may be the same, such as by way of example, material jetting. Alternatively, material extrusion, among a variety of other AM processes may be employed for all of the layers. In another form, different AM processes are used for different layers.

Unless otherwise expressly indicated herein, all numerical values indicating mechanical/thermal properties, compositional percentages, dimensions and/or tolerances, or other characteristics are to be understood as modified by the word "about" or "approximately" in describing the scope of the present disclosure. This modification is desired for various reasons including industrial practice, material, manufacturing, and assembly tolerances, and testing capability.

As used herein, the phrase at least one of A, B, and C should be construed to mean a logical (A OR B OR C), using a non-exclusive logical OR, and should not be construed to mean "at least one of A, at least one of B, and at least one of C."

The description of the disclosure is merely exemplary in nature and, thus, variations that do not depart from the substance of the disclosure are intended to be within the scope of the disclosure. Such variations are not to be regarded as a departure from the spirit and scope of the disclosure.

What is claimed is:

1. A method of manufacturing an electronics assembly, the method comprising:
   forming a base layer using an additive manufacturing process;
   forming a first thermally and electrically conductive intermediate layer onto the base layer using an additive manufacturing process;
   placing an electronics component onto the first thermally and electrically conductive intermediate layer, the electronics component comprising a plurality of vias;
   forming a second thermally and electrically conductive intermediate layer over the first thermally and electrically conductive intermediate layer and over at least a portion of the electronics component using an additive manufacturing process, wherein a material of the second thermally and electrically conductive intermediate layer extends through the vias to contact the first thermally and electrically conductive intermediate layer and the vias, thereby forming a bond therebetween; and
   forming a protective layer over at least a portion of the second thermally and electrically conductive intermediate layer using an additive manufacturing process.

2. The method according to claim 1, wherein the base layer is a thermally conductive material.

3. The method according to claim 1, wherein the protective layer is an electrically nonconductive material.

4. The method according to claim 1, wherein the protective layer is thermally conductive.

5. The method according to claim 1, wherein the electronics component is placed onto the first thermally and electrically conductive intermediate layer by a robot.

6. The method according to claim 1, wherein the electronics component comprises an LED, and the method further comprises forming an optical layer adjacent to the LED using an additive manufacturing process.

7. The method according to claim 1, wherein each of the additive manufacturing processes are the same.

8. The method according to claim 7, wherein each of the additive manufacturing processes comprises material jetting or material extrusion.

9. The method according to claim 1, wherein each of the layers comprise a polymeric material.

10. An electronics assembly formed by a process comprising:
    forming a base layer using an additive manufacturing process;
    forming a first thermally and electrically conductive intermediate layer onto the base layer using an additive manufacturing process;
    placing an electronics component onto the first thermally and electrically conductive intermediate layer, the electronics component comprising a plurality of vias;
    forming a second thermally and electrically conductive intermediate layer over the first thermally and electrically conductive intermediate layer and over at least a portion of the electronics component using an additive manufacturing process, wherein a material of the second thermally and electrically conductive intermediate layer extends through the vias to contact the first thermally and electrically conductive intermediate layer and the vias, thereby forming a bond therebetween; and
    forming a protective layer over at least a portion of the second thermally and electrically conductive intermediate layer using an additive manufacturing process.

11. The electronics assembly according to claim 10, wherein the electronics component comprises:
    a printed circuit board; and
    at least two conductive pads secured to the printed circuit board, each of the conductive pads comprising an upper surface and a lower surface, wherein the plurality of vias extend through the printed circuit board to connect the upper surfaces to the lower surfaces.

12. The electronics assembly according to claim 11, wherein each conductive pad comprises gold plating, wherein the gold plating extends along interior surfaces of the vias, along the upper surfaces, and along the lower surfaces.

13. The electronics assembly according to claim 11, wherein the electronics component comprises an LED secured to the conductive pads and an optical lens disposed adjacent to the LED.

14. The electronics assembly according to claim 10, wherein the base layer comprises a support pad, and the electronics component is placed onto the support pad before forming the second thermally and electrically conductive intermediate layer.

15. The electronics assembly according to claim 10, wherein the second thermally and electrically conductive intermediate layer comprises at least one aperture to provide access to the electronics component.

16. The electronics assembly according to claim 10, wherein the conductive pads are formed using an additive manufacturing process.

17. The electronics assembly according to claim 10, wherein each of the additive manufacturing processes are the same.

18. The electronics assembly according to claim 17 wherein each of the additive manufacturing processes comprises material jetting or material extrusion.

19. A method of manufacturing an electronics assembly, the method comprising:
    forming a base layer using an additive manufacturing process;
    forming a first thermally and electrically conductive intermediate layer onto the base layer using the additive manufacturing process;
    placing an electronics component onto the first thermally and electrically conductive intermediate layer, the electronics component comprising a plurality of vias;
    forming a second thermally and electrically conductive intermediate layer over the first thermally and electrically conductive intermediate layer and over at least a portion of the electronics component using the additive manufacturing process, wherein a material of the second thermally and electrically conductive intermediate layer extends through the vias to contact the first thermally and electrically conductive intermediate layer and the vias, thereby forming a bond therebetween; and
    forming a protective layer over at least a portion of the second thermally and electrically conductive intermediate layer using the additive manufacturing process.

20. The method according to claim 19, wherein the additive manufacturing process comprises material jetting or material extrusion.

* * * * *